United States Patent [19]
Peaker et al.

[11] 3,872,314
[45] Mar. 18, 1975

[54] ELECTROLUMINESCENT DEVICES AND APPARATUS INCLUDING SUCH DEVICES

[75] Inventors: Anthony Ralph Peaker, Saddleworth; Anthony Mottram, Romiley, both of England

[73] Assignee: Ferranti Limited, Hollinwood, Lancashire, England

[22] Filed: Jan. 16, 1974

[21] Appl. No.: 433,792

[30] Foreign Application Priority Data
Jan. 18, 1973 United Kingdom..............2703/73

[52] U.S. Cl.................. 250/552, 250/553, 313/500, 357/19
[51] Int. Cl....... G02f 1/28, H01l 11/00, H01l 15/00
[58] Field of Search.................... 250/213, 552, 553; 313/498, 499, 500; 317/235 N; 357/19

[56] References Cited

UNITED STATES PATENTS 3,440,497 4/1969 Keyes et al. ........................ 313/499

*Primary Examiner*—James W. Lawrence
*Assistant Examiner*—T. N. Grigsby
*Attorney, Agent, or Firm*—Cameron, Kerkam, Sutton, Stowell & Stowell

[57] ABSTRACT

An electroluminescent device with a P-N junction capable of emitting electromagnetic radiation and with a negative resistance characteristic is formed in a III-V compound semiconductor such as gallium phosphide or gallium arseno-phosphide, the device including across its current path a current impeding portion with a small concentration of less than $5 \times 10^{15}$ free charge carriers per cm.$^3$, the arrangement being such that the current impeding action of the portion is reduced to a greater extent by radiation emitted by the P-N junction than by minority charge carrier interaction between the portion and the P-N junction.

21 Claims, 4 Drawing Figures

ELECTROLUMINESCENT DEVICES AND APPARATUS INCLUDING SUCH DEVICES

Figure 1:
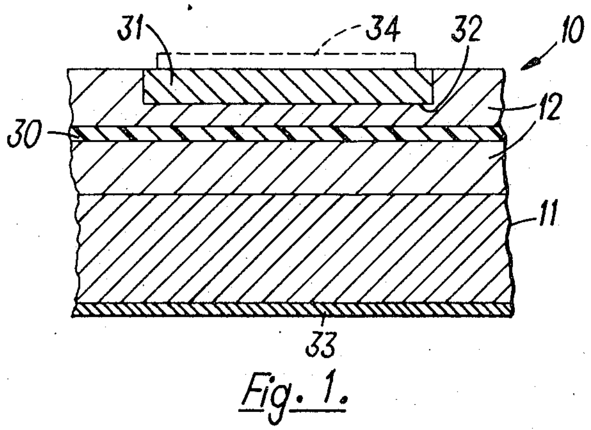

This invention relates to electroluminescent devices, and in particular to such devices each comprising a semiconductor body of a III-V compound semiconductor and having a P-N junction which emits electromagnetic radiation when biassed by an electrical potential; and to display apparatus including such devices. The III-V compound semiconductor may be either an indirect gap semiconductor such as gallium phosphide or gallium arseno-phosphide, or a direct gap semiconductor such as gallium arsenide. An indirect gap semiconductor is one in which electrons need a change in both energy and momentum to be displaced between the conduction band and the valence band. At least the parts of the body of the III-V compound semiconductor including the P-N junction may be doped with nitrogen or a material isoelectronic with phosphorus in the host lattice structure of the layer, especially when the semiconductor is an indirect gap semiconductor.

It is known for an electroluminescent device in the form of a PNPN diode to have a negative resistance characteristic, a P-N junction of which emits electromagnetic radiation by the application of a biassing electrical potential of a magnitude greater than a predetermined value, and subsequently is capable of emitting electromagnetic radiation when the applied electrical potential is reduced to a level below that of the predetermined value but above a threshold value. Within such a device there is minority charge carrier interaction between constituent parts of the device.

It is an object of the present invention to provide a novel and advantageous construction for an electroluminescent device having a negative resistance characteristic.

According to the present invention an electroluminescent device with a P-N junction capable of emitting electromagnetic radiation and with a negative resistance characteristic comprises a body having on a suitable substrate an epitaxially deposited layer of a III-V compound semiconductor, within the layer there being provided a region of one conductivity type and a region of the opposite conductivity type with the P-N junction therebetween, the region of said one conductivity type has a current impeding portion with a small concentration of less than $5\times10^{15}$ free charge carriers per cm.$^3$, the current impeding portion is at least two diffusion lengths of minority charge carriers away from the P-N junction, and the device also includes contact means, the arrangement being such that when an electrical potential greater than a predetermined value is applied to the contact means the P-N junction is biassed and emits electromagnetic radiation, there being a current path through the device with the current impeding portion wholly across the current path, the radiation emitted by the P-N junction causing a reduction in the current impeding action of the portion to an extent greater than the reduction caused by minority charge carrier interaction between the portion and the P-N junction, and because of the reduction in the current impeding action of the portion the P-N junction continuing to emit electromagnetic radiation so long as the magnitude of the applied electrical potential is above a threshold value lower than the predetermined value.

In the host lattice structure of the epitaxial layer there are positions which are each occupied by a nitrogen atom or an atom or molecule of a material isoelectronic with phosphorus in the host lattice structure. Thus, the material comprises respectively either an element or a complex of elements, a complex of elements isoelectronic with phosphorus being considered as having a molecular construction including an equivalent to the outer electron shell of a phosphorus atom.

When the P-N junction is irradiated with radiation of a wavelength within a band of wavelengths which cause the effect of the current impeding portion to be reduced, the radiation being incident on the current impeding portion from outside the device, the magnitudes of the predetermined value and the threshold value of the electrical potential to be applied across the P-N junction are lowered.

The region including the current impeding portion may be of either P conductivity type or of N conductivity type.

The current impeding portion of the required small concentration of less than $5\times10^{15}$ free charge carriers per cm.$^3$ may have a composition differing to the desired extent from the stoichiometric mixture of the constituents of the compound semiconductor. In such circumstances the current impeding portion may be doped with a deep level impurity, the arrangement being such that the concentration of the deep level impurity is greater than the concentration of the conductivity-type-determining impurity.

The P-N junction of such a device may emit the electromagnetic radiation either when forward biassed or when reversed biassed. For convenience, in this specification the P-N junction will be referred to as being biassed when the sense of an applied potential is an appropriate one to cause the P-N junction to emit the electromagnetic radiation.

The spacing of the current impeding portion at least two diffusion lengths of minority charge carriers away from the P-N junction ensures that the radiation emitted by the P-N junction has a greater effect on the portion than minority charge carrier interaction between the portion and the P-N junction.

The predetermined value of the electrical potential is a function of the thickness of the current impeding portion, and the threshold value is determined by the physical properties of the materials of the electroluminescent device.

According to another aspect the present invention comprises a method of manufacturing an electroluminescent device referred to above.

According to yet another aspect the present invention comprises display apparatus comprising an array of a plurality of the electroluminescent devices referred to above.

Figure 2:
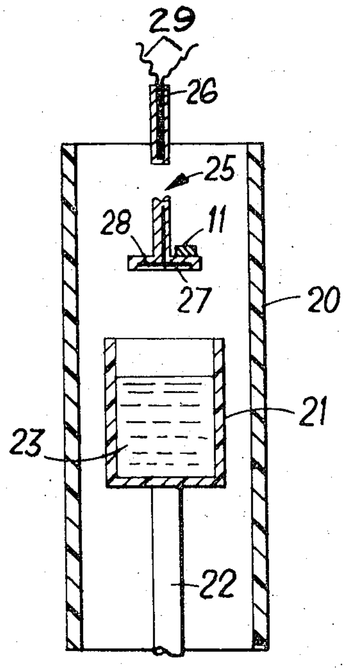
Figure 3:
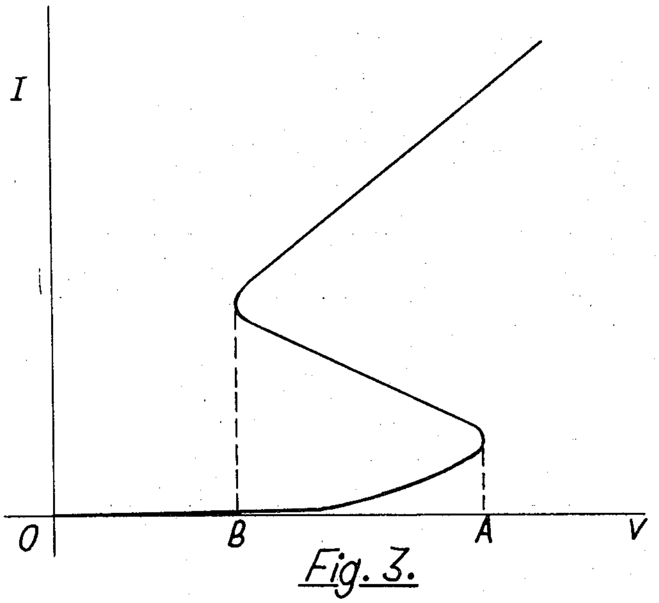
Figure 4:
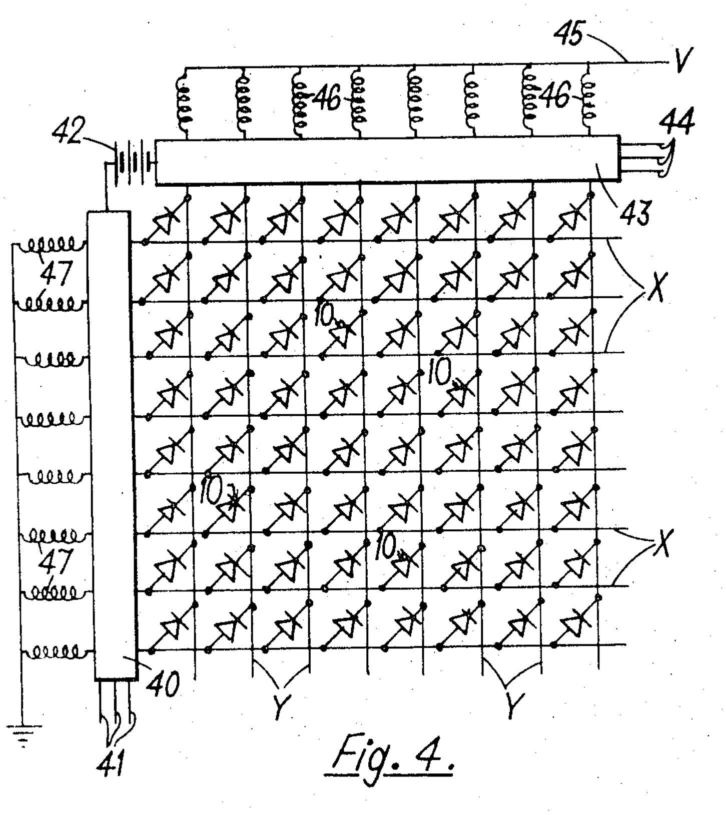

The present invention will now be described by way of example with reference to the accompanying drawings, in which FIG. 1 is a section of a gallium phosphide electroluminescent device, and according to one embodiment of the present invention, FIG. 2 is a section of apparatus for the manufacture of the electroluminescent device of FIG. 1, and for the epitaxial deposition of a layer of semiconductor material from the liquid phase onto a substrate, FIG. 3 comprises the voltage-current characteristic of the electroluminescent device of FIG. 1, and FIG. 4 is a circuit diagram of display apparatus including a plurality of electroluminescent devices according to the present invention, the electroluminescent devices being arranged as a regular, rectangular array.

The electroluminescent device 10 illustrated in FIG. 1 is formed in a body of gallium phosphide semiconductor material. The body comprises a substrate 11 in the form of a pulled crystal. The substrate is lapped, polished and etched. Then the substrate is placed in molten gallium saturated with gallium phosphide and doped with nitrogen. The melt is also doped with a very much smaller concentration of sulphur than that of nitrogen, and an N-type monocrystalline region 12 of gallium phosphide heavily doped with nitrogen is deposited by liquid phase epitaxy onto the substrate 11.

As shown in FIG. 2, the liquid phase epitaxy apparatus comprises a furnace having a hollow quartz tube 20 mounted with its axis vertical. Within the quartz tube 20 is provided a quartz crucible 21 mounted on a rod 22 by which the crucible 21 is inserted into, or is withdrawn from, the quartz tube 20. The crucible 21 is charged with the constituents of the desired melt referred to above, and is heated in a hydrogen atmosphere in the quartz tube to a temperature of 1050° C to melt the charge. The melt is indicated generally at 23. When the charge is molten the substrate 11 is placed on a holder 25 and is immersed in the melt 23. The holder 25 comprises a hollow quartz member with a hollow stem 26 on one end of which is provided a hollow flat plate 27, the hollow part of the plate being in communication with the hollow part of the stem. An electrical resistance heating element 28 is provided within the hollow part of the plate 27, the electrical leads 29 from the heating element extending through the hollow part of the stem 26 to an electrical source (not shown).

The substrate 11 is supported by the holder 25 and extends horizontally on the upper surface of the plate 27 of the holder.

The N type region 12 of the electroluminescent device 10 is deposited on the substrate 11 whilst the substrate is in the melt 23. The concentration of sulphur in the bulk of the deposited region is in the range $10^{16}$ to $5\times10^{17}$ atoms per $cm.^3$, and preferably is in the range $5\times10^{16}$ to $10^{17}$ atoms per $cm.^3$. The nitrogen concentration in the bulk of the region is in the range $10^{16}$ to $10^{19}$ atoms per $cm.^3$; and preferably is in the range $5\times10^{17}$ to $5\times10^{18}$ atoms per $cm^3$.

Whilst the rate of deposition of the semiconductor material is controlled so that the bulk of the region has concentrations of the impurities within the desired ranges, a current impeding portion 30 is provided within the N-type region 12. The current impeding portion 30 has a free charge carrier concentration of less than the small value of $5\times10^{15}$ per $cm^3$. The current impeding portion 30 is provided by temporarily causing the electrically active concentration of sulphur in the melt 23 and adjacent to the substrate 11 to be reduced, and the composition of the deposited material differs to the desired extent from the stoichiometric mixture of the constituents of the compound semiconductor, when the portion 30 is to be formed. In addition, a deep level impurity present in the melt 23, such as silicon, may be deposited to act as an acceptor impurity within the portion 30. The rate of deposition of the semiconductor material is controlled by the construction of the deposition apparatus, the crystallographic orientation of the substrate, the polarity of the material being deposited, the impurity concentration in the melt, the rate of cooling of the melt, and the magnitude of the temperature gradient within the melt and adjacent to the substrate. The required temporary reduction in the concentration of sulphur in the melt and adjacent to the substrate, and the required variation from the stoichiometric mixture of the compound semiconductor, when the portion 30 is to be deposited is obtained by depositing the semiconductor material under different conditions than is normal. The desired change of the deposition conditions may occur substantially throughout the deposition of the N-type region 12, the sulphur concentration in the melt and adjacent to the substrate changing from an initial required value, and then after the formation of the portion 30, automatically returning to the required value. Alternatively the desired change of the deposition conditions may be only temporary, i.e. during the formation of the portion 30. A temporary change in the deposition rate may be caused by the apparatus shown in FIG. 2 by transiently increasing the temperature of the substrate by energising for an appropriate period the heating element 28 in the substrate holder 25, and so altering the temperature gradient across the substrate-epitaxial layer interface and in the melt adjacent to the substrate.

By supporting the substrate 11 so that it extends horizontally on the holder 25, rather than to extend vertically, the N-type region 12 has a more desirable surface, and it is possible to provide the desired N-type regions simultaneously on a plurality of substrates in a batch process.

The electroluminescent device 10 is completed by providing a region 31 of P conductivity type on the N-type region 12. The P type region 31 may be provided by liquid phase epitaxy in a step similar to that described above in relation to the formation of the N-type region 12, or as shown in FIG. 1, by diffusion of an acceptor impurity into a selected part of the N-type region. The acceptor impurity may comprise zinc, and if it is diffused into the N-type region a low temperature of 650° C is employed so that the surface of the semiconductor body is not damaged during the diffusion step and a high concentration of zinc at the surface of the body is avoided. The P-N junction 32 provided between the N-type region 12 and the P-type region 31 emits electromagnetic radiation when biassed by an electrical potential, the electromagnetic radiation comprising light in the green part of the visible spectrum. In a diffusion step a concentration of zinc within the range $10^{18}$ to $10^{19}$ atoms per $cm.^3$ is required in the P-type region 31, and the electroluminescent efficiency of the device is of the order of 0.1 to 0.2 percent.

Contacts are provided to the substrate, as shown in continuous line form at 33, and to the P-type region, as shown in broken line form at 34. The contacts may be provided in a known manner, and the electroluminescent device 10 may be housed in any suitable way.

The current impeding portion 30 extends wholly across the current path through the device 10.

The voltage-current characteristic of the device is shown in FIG. 3. When the P-N junction 32 is initially biassed by the application of an electrical potential the magnitude of the current flowing through the device is reduced by the presence of the current impeding portion 30. However, as the level of the biassing electrical potential increases the intensity of the electromagnetic radiation emitted by the P-N junction increases. When the biassing electrical potential reaches a predetermined value 'A' the P-N junction is emitting electromagnetic radiation at a particular intensity and the effect of the portion 30 has been reduced to such an extent that the device has a negative resistance effect. The magnitude of the predetermined value is a function of the thickness of the portion 30, and in one particular embodiment of an electroluminescent device according to the present invention the predetermined value of the biassing electrical potential is less than 10 volts. The applied potential biassing the P-N junction then may be reduced to a threshold value, indicated at the point 'B', and will continue to emit a significant amount of electromagnetic radiation. Thus, the device is capable of a self-latching action by the initial application of a biassing potential greater than the predetermined value, and then biassing the P-N junction by an electrical potential greater than the threshold value. The P-N junction may be biassed by an electrical potential at a level above the threshold value before the application of a voltage pulse at the predetermined value. When the P-N junction is biassed continuously at a level above the threshold value, the electroluminescent device may be caused to stop emitting the electromagnetic radiation by the application of a voltage pulse across the P-N junction 32 of a level lower than the threshold value, or of opposite sense to that causing the device to emit the electromagnetic radiation. The magnitude of the threshold value is determined by the physical properties of the materials of the electroluminescent device.

The reduction of the current impeding effect of the portion 30 by the radiation emitted by the P-N junction is greater than the reduction caused by minority charge carrier interaction between the portion and the P-N junction. This is ensured by the portion 30 being at least two diffusion lengths of minority charge carriers away from the P-N junction 32.

The composition of the portion 30 merely may differ to the desired extent from the stoichiometric mixture of the constituents of the compound semiconductor, and so has a free charge carrier concentration of less than the small value of $5\times10^{15}$ per $cm^3$.

Instead of the N type region 12 being contiguous with the substrate 11 the P type region 31 may be so contiguous. Thus, the P type region is initially epitaxially deposited from the liquid phase, and the N type region then may be so deposited onto the P type region.

Further, the current impeding portion 30 may be provided in the P type region 31 instead of the N type region 12, and if the portion is doped with a deep level impurity the arrangement is such that this impurity acts as a donor.

In addition, there would be no control in the manner of operation of the device if the substrate is employed as an injection layer due to minority charge carrier interaction. Thus, a device with reproducible properties may be manufactured by ensuring that this criterion is obtained. Further, if the portion 30 is contiguous with the substrate the predetermined level of the electrical potential biassing the P-N junction is much higher than if the portion 30 is at least two diffusion lengths of minority charge carriers away from the substrate 11.

When the P-N junction is irradiated with radiation of a wavelength within a band of wavelengths which cause the effect of the current impeding portion 30 to be reduced, the radiation being incident on the current impeding portion from outside the device, the magnitudes of the predetermined value and the threshold value of the electrical potential to be applied across the P-N junction are lowered. Thus, the radiation incident on the current impeding portion may be of the same wavelength as that of the radiation emitted by the device, or it may be of any wavelength within the appropriate band. Hence, the device may be caused to start emitting radiation by irradiation from another, similar, device, or from any suitable source of the radiation, such as a laser or light pen.

The electroluminescent device may be caused to emit the electromagnetic radiation by the application of an electrical potential either to forward bias or to reverse bias the P-N junction.

The semiconductor material may be gallium arsenophosphide, or any indirect gap or direct gap III-V compound semiconductor and the layer may be epitaxially deposited onto the substrate from the vapour phase, the current impeding portion being formed by, for example, varying the atmosphere composition from which the deposition occurs.

The device emits electromagnetic radiation of photon energy near the band gap of the semiconductor material, and the electromagnetic radiation may be other than green light.

The substrate of the device may be any suitable material for the epitaxial deposition thereon of the layer of, for example, gallium phosphide or gallium arsenophosphide.

Especially when the semiconductor is an indirect gap semiconductor the layer may be doped with any material isoelectronic with phosphorus in the host lattice structure of the region, for example, nitrogen. Only the part of the epitaxial layer including the P-N junction may be so doped.

A plurality of the electroluminescent devices 10 described above may be provided simultaneously in a single semiconductor body, especially because each electroluminescent device may be manufactured by forming a P-type region 31 by diffusion of an acceptor impurity into a selected part of a common N-type region 12 of the semiconductor body. Thus, an array of the electroluminescent devices may be provided in a single body, and the array may be part of display apparatus. Such display apparatus is shown in diagrammatic form in FIG. 4, the plurality of electroluminescent devices providing an 8 by 8 array in a single semiconductor body, each device being indicated as a diode 10. Each diode 10 is required to be in series with a resistor (not shown), and this resistor conveniently is provided within the substrate 11 of the diode 10.

Each row of electroluminescent devices of the array is connected to an X address line, different rows being connected individually to different X address lines. Similarly, each column of electroluminescent devices of the array is connected to a Y address line, different columns being connected individually to different Y address lines. The X address lines are connected to decoding means 40, which in response to input information signals in binary coded form and provided on three leads 41, causes the X address lines to be connected to one terminal of an electrical source associated with the display apparatus, and indicated at 42. The arrangement is such that each address line is connected individually and consecutively to the electrical source 42. When an X address line is so connected to the electrical source each electroluminescent device 10 connected to the X address line is rendered capable of being selected, the electroluminescent device emitting electromagnetic radition when selected. The Y address lines are connected to decoding means 43, which in response to input information signals in binary coded form and provided on three leads 44, causes the Y address lines of be connected individually to the other terminal of the associated electrical source 42. When a Y address line is so connected to one terminal of the electrical source the electroluminescent device connected to the Y address line, and also connected to the X address line connected to the other terminal of the electrical source 42, receives a voltage pulse to bias its P-N junction. The magnitude of this pulse is greater than the predetermined value 'A', the P-N junction emits electromagnetic radiation at at least the particular intensity, and the electroluminescent device is individually selected. The selected electroluminescent device continues to emit the electromagnetic radiation at a significant intensity if the electrical potential biassing the P-N junction is maintained at a value above the threshold value after the pulse from the electrical source 42 is removed. Conveniently, the P-N junction of each electroluminescent device of the array is biassed by an electrical potential at a level above the threshold value but below the predetermined value throughout the operation of the display apparatus, and thus the electroluminescent device is self-latching when selected. The means by which each electroluminescent device of the array is biassed at above the threshold value is indicated in FIG. 4 by a rail 45 maintained at an appropriate potential V, and connected via inductances 46 to each Y address line irrespective of whether or not the Y address lines are connected to the electrical source 41 by the decoding means 43. Each X address line is connected to a point maintained at zero potential via inductances 47, each X address line being connected to the point at zero potential irrespective of whether or not the X address lines are connected to the electrical source 41 by the decoding means 40.

The arrangement is such that, in response to the input information signals, a desired pattern of the electroluminescent devices of the array are selected and caused to emit electromagnetic radiation. Thus, when an X address line is connected to one terminal of the associated electrical source 42, and each electroluminescent device connected to this X address line is rendered capable of being selected, the electroluminescent devices connected to this X address line and to be selected are connected consecutively to the other terminal of the electrical source via the appropriate Y address lines. Hence, the selected electroluminescent devices are caused to commence emitting electromagnetic radiation row by row and continue to emit the electromagnetic radiation after the pulses from the electrical source are terminated. The selected electroluminescent devices continue to emit electromagnetic radiation without the need to supply refreshing input information signals. The selected electroluminescent devices may be caused to cease to emit electromagnetic radiation by applying a voltage pulse of a level lower than the threshold value, or of opposite sense, across the P-N junctions of each electroluminescent device of the array by means (not shown).

The display apparatus described above may have an array of electroluminescent devices of any desired configuration, and may have any desired number of electroluminescent devices. The decoding means required, because of the self-latching of the electroluminescent devices is simpler than has been required with known constructions of display apparatus of this type.

The display apparatus may comprise a plurality of discrete electroluminescent devices according to the present invention, instead of providing the electroluminescent devices in a single semiconductor body.

The electroluminescent devices may be employed in other applications than in display apparatus substantially as described above. For example, an array may be provided whereby upon causing a first device to emit electromagnetic radiation one or more adjacent devices are caused to emit radiation by the radiation from the first device if the electrical potential across the P-N junction of each such further device is above the threshold value commensurate with the intensity of radiation it receives from the first device. The arrangement may be such that a chain reaction is caused, the emission from the first device causing a second device to emit, and the emission from the second device causing a third device to emit, etc. In an array arranged to provide such a chain reaction, the arrangement may be such that the number of devices caused to emit represents the magnitude of a voltage applied across the array, each device caused to emit having an electrical potential greater than the threshold value across its P-N junction. Any such array may have a monolithic construction, being formed in a single semiconductor body, or it may be formed from a plurality of semiconductor bodies formed into a unitary structure in the required way.

In another form of array, the devices of the array are arranged to be caused to emit selectively by selective irradiation by radiation of an appropriate wavelength from a laser or light pen.

What we claim is:

1. An electroluminescent device with a P-N junction capable of emitting electromagnetic radiation with a negative resistance characteristic comprising a body having on a suitable substrate an epitaxially deposited layer of a III-V compound semiconductor, within the layer there being provided a region of one conductivity type and a region of the opposite conductivity type with the P-N junction therebetween, the region of said one conductivity type has a current impeding portion with a small concentration of less than $5\times10^{15}$ free charge carriers per cm.$^3$, the current impeding portion is at least two diffusion lengths of minority charge carriers away from the P-N junction, and the device also includes contact means, the arrangement being such that when an electrical potential greater than a predetermined value is applied to the contact means the P-N junction is biassed and emits electromagnetic radiation, there being a current path through the device with the current impeding portion wholly across the current path, the radiation emitted by the P-N junction causing a reduction in the current impeding action of the portion to an extent greater than the reduction caused by minority charge carrier interaction between the portion and the P-N junction, and because of the reduction in the current impeding action of the portion the P-N junction continuing to emit electromagnetic radiation so long as the magnitude of the applied electrical potential is above a threshold value lower than the predetermined value.

2. A device as claimed in claim 1 in which the current impeding portion has a composition differing to the desired extent from the stoichiometric mixture of the constituents of the compound semiconductor.

3. A device as claimed in claim 2 in which the current impeding portion is doped with a deep level impurity and the arrangement is such that the concentration of the deep level impurity is greater than the concentration of the conductivity-type-determining impurity.

4. A device as claimed in claim 1 in which the III-V compound semiconductor of the epitaxial layer is gallium phosphide or gallium arseno-phosphide, and at least the part of the layer including the P-N junction are doped with nitrogen or a material isoelectronic with phosphorus in the host lattice structure of the layer.

5. A method of manufacturing an electroluminescent device with a P-N junction capable of emitting electromagnetic radiation and with a negative resistance characteristic comprising epitaxially depositing onto a suitable substrate a layer of a compound semiconductor, within the layer there being provided a region of one conductivity type and a region of the opposite conductivity type with the P-N junction therebetween, the region of said one conductivity type having a current impeding portion with a small concentration of less than $5\times10^{15}$ free charge carriers per $cm.^3$, the current impeding portion being at least two diffusion lengths of minority charge carriers away from the P-N junction, and providing the device with contact means, the arrangement being such that when an electrical potential greater than a predetermined value is applied to the contact means the P-N junction is biassed and emits electromagnetic radiation, there being a current path through the device with the current impeding portion wholly across the current path, the radiation emitted by the P-N junction causing a reduction in the current impeding action of the portion to an extent greater than the reduction caused by minority charge carrier interaction between the portion and the P-N junction, and because of the reduction in the current impeding action of the portion the P-N junction continuing to emit electromagnetic radiation so long as the magnitude of the applied electrical potential is above a threshold value lower than the predetermined value.

6. A method as claimed in claim 5 in which the layer is epitaxially deposited onto the substrate from the liquid phase.

7. A method as claimed in claim 5 in which the layer is epitaxially deposited onto the substrate from the vapour phase.

8. A method as claimed in claim 5 in which the region of said one conductivity type is provided on the substrate in a first epitaxial deposition step, and the region of said opposite conductivity type is provided on the region of said one conductivity type in a second epitaxial deposition step.

9. A method as claimed in claim 5 in which the region of said opposite conductivity type is P type and is provided by diffusion of an acceptor impurity into a selected part of an epitaxially deposited layer initially wholly of N conductivity type.

10. A method as claimed in claim 5 in which the current impeding portion has a composition differing to the desired extent from the stoichiometric mixture of the constituents of the compound semiconductor by varying in the appropriate manner the epitaxial deposition conditions during the formation of the region of said one conductivity type.

11. A method as claimed in claim 10 in which the current impeding portion is doped with a deep level impurity and the arrangement is such that the concentration of the deep level impurity is greater than the concentration of the conductivity-type-determining impurity.

12. A method as claimed in claim 5 in which the III-V compound semiconductor of the epitaxial layer is gallium phosphide or gallium arseno-phosphide, and at least the parts of the layer including the P-N junction are doped with nitrogen or a material isoelectronic with phosphorus in the host lattice structure of the layer.

13. Display apparatus comprising an array of a plurality of electroluminescent devices, each electroluminescent device having a P-N junction capable of emitting electromagnetic radiation and with a negative resistance characteristic comprising a body having on a suitable substrate an epitaxially deposited layer of a III-V compound semiconductor, within the layer there being provided a region of one conductivity type and a region of the opposite conductivity type with the P-N junction therebetween, the region of said one conductivity type has a current impeding portion with a small concentration of less than $5\times10^{15}$ free charge carriers per $cm.^3$, the current impeding portion is at least two diffusion lengths of minority charge carriers away from the P-N junction, and the device also includes contact means, the arrangement being such that each electroluminescent device may be connected to an electrical source associated with the display apparatus so than an electrical potential of at least a predetermined value biasses the P-N junction and when so biassed the P-N junction emits electromagnetic radiation, there being a current path through the device with the current impeding portion wholly across the current path, the radiation emitted by the P-N junction causing a reduction in the current impeding action of the portion to an extent greater than the reduction caused by minority charge carrier interaction between the portion and the P-N junction, and because of the reduction in the current impeding action of the portion the P-N junction continuing to emit electromagnetic radiation so long as the magnitude of the applied electrical potential is above a threshold value lower than the predetermined value.

14. Display apparatus as claimed in claim 13 in which the current impeding portion of each electroluminescent device has a composition differing to the desired extent from the stoichiometric mixture of the constituents of the compound semiconductor.

15. Display apparatus as claimed in claim 14 in which the current impeding portion of each electroluminescent device is doped with a deep level impurity and the arrangement is such that the concentration of the deep level impurity is greater than the concentration of the conductivity-type-determining impurity.

16. Display apparatus as claimed in claim 13 in which the III-V compound semiconductor of the epitaxial layer is gallium phosphide or gallium arseno-phosphide, and at least the parts of the layer including the P-N junction are doped with nitrogen or a material isoelectronic with phosphorus in the host lattice structure of the layer.

17. Display apparatus as claimed in claim 13 in which at least one electroluminescent device is arranged so that radiation may be incident on the P-N junction thereof from outside the device to lower the magnitudes of the predetermined value and the threshold value of the electrical potential to be applied to the device to bias the P-N junction.

18. Display apparatus as claimed in claim 17 in which the arrangement is such that the electroluminescent device is arranged to be irradiated by radiation emitted by an adjacent electroluminescent device of the array of devices.

19. Display apparatus as claimed in claim 17 in which means to irradiate at least one electroluminescent device is provided outside the array of devices, the means comprising a source of radiation such as a laser.

20. Display apparatus as claimed in claim 13 and in the form of a unitary structure including a plurality of semiconductor bodies in which the electroluminescent devices are provided.

21. Display apparatus as claimed in claim 13 in which at least the plurality of electroluminescent devices are provided in a single semiconductor body.

* * * * *